United States Patent
Chung

(10) Patent No.: US 7,623,097 B2
(45) Date of Patent: Nov. 24, 2009

(54) EMISSION CONTROL DRIVER AND ORGANIC LIGHT EMITTING DISPLAY DEVICE HAVING THE SAME AND A LOGICAL OR CIRCUIT FOR AN EMISSION CONTROL DRIVER FOR OUTPUTTING AN EMISSION CONTROL SIGNAL

(75) Inventor: Bo-Yong Chung, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 644 days.

(21) Appl. No.: 11/457,198

(22) Filed: Jul. 13, 2006

(65) Prior Publication Data
US 2007/0040786 A1 Feb. 22, 2007

(30) Foreign Application Priority Data

Aug. 17, 2005 (KR) .............. 10-2005-0075428
Aug. 17, 2005 (KR) .............. 10-2005-0075429

(51) Int. Cl.
*G09G 3/30* (2006.01)
(52) U.S. Cl. .................................. 345/76; 345/204
(58) Field of Classification Search ........... 345/76–100, 345/204
See application file for complete search history.

(56) References Cited

U.S. PATENT DOCUMENTS

| 5,093,464 | A | 3/1992 | Yoon et al. | |
| 6,229,506 | B1 * | 5/2001 | Dawson et al. | 345/82 |
| 2004/0080474 | A1 * | 4/2004 | Kimura | 345/82 |
| 2004/0090400 | A1 * | 5/2004 | Yoo | 345/76 |

| 2004/0196239 | A1 | 10/2004 | Kwon |

(Continued)

FOREIGN PATENT DOCUMENTS

CN 1312535 9/2001

(Continued)

OTHER PUBLICATIONS

N. Komiya and H. K. Chung—A Self-compensated Voltage Programming Pixel Structure for Active Matrix Organic Light Emitting Diodes, IDW 2003, Corporate R&D Center—Samsung SDI Co., Ltd., pp. 535-538.*

(Continued)

*Primary Examiner*—Richard Hjerpe
*Assistant Examiner*—Carolyn R Edwards
(74) *Attorney, Agent, or Firm*—H.C. Park & Associates, PLC

(57) ABSTRACT

An organic light emitting display (OLED) device using a tiling technique including a system-on-panel (SOP)-type emission control driver. The emission control driver includes a shift register and a logical operation portion having a plurality of logic gates, each of which receives output signals from the shift register and performs a logical OR operation on the received signals. An active load of each of the logic gates is controlled using two output signals and two inverted output signals of two adjacent flip-flops. Also, each of the logic gates performs a logical OR operation on the two output signals of the two adjacent flip-flops and generates an emission control signal. The flip-flops and the logic gates of the emission control driver include positive channel metal oxide semiconductors (PMOS) transistors.

20 Claims, 8 Drawing Sheets

U.S. PATENT DOCUMENTS

2005/0093464 A1* 5/2005 Shin et al. ................. 315/169.1
2005/0116656 A1* 6/2005 Shin ......................... 315/169.3

FOREIGN PATENT DOCUMENTS

CN          1471068         1/2004
EP          1653434         5/2006

OTHER PUBLICATIONS

Choi S. M. et al.; "A Self-Compensated Voltage Programming Pixel Structure For Active-Matrix Organic Light Emitting Diodes"; IDW. Proceedings of the International Display Workshops, XX, XX, 2003, pp. 535-538, XP008057381.

* cited by examiner

EMISSION CONTROL DRIVER AND ORGANIC LIGHT EMITTING DISPLAY DEVICE HAVING THE SAME AND A LOGICAL OR CIRCUIT FOR AN EMISSION CONTROL DRIVER FOR OUTPUTTING AN EMISSION CONTROL SIGNAL

CROSS-REFERENCE TO RELATED APPLICATION

This application claims priority to and the benefit of Korean Patent Application No. 10-2005-0075428, filed on Aug. 17, 2005, and Korean Patent Application No. 10-2005-0075429, filed on Aug. 17, 2005, which are incorporated herein by reference for all purposes as if fully set forth herein.

BACKGROUND OF THE INVENTION

1. Field of the Invention

The present invention relates to an emission control driver and an organic light emitting display (OLED) device having the same and, more particularly, to a system-on-panel (SOP)-type emission control driver which generates signals to control emission of pixels and an OLED device having the same.

2. Discussion of the Background

Flat panel displays (FPDs) have been developed because they can be made smaller and lighter than display devices using cathode ray tubes (CRTs). In turn, FPD technology has given rise to liquid crystal displays (LCDs), field emission displays (FEDs), plasma display panels (PDPs), and organic light emitting displays (OLEDs). Among these FPDs, the PDP may have a large screen, but suffers from low luminance and poor luminous efficiency resulting in high power consumption. Moreover, the LCD has a relatively slow response speed and consumes a large quantity of power since it employs a backlight.

However, since the OLED makes use of an organic material to emit light, it has a wider viewing angle and faster response speed than the LCD. Also, the OLED is an emissive display that obtains good contrast and visibility. Further, the OLED consumes less power and can be made thin and lightweight because it needs no backlight.

Nevertheless, when the OLED is constructed to have a large screen, the dimensions of an electroluminescent (EL) panel used for a glass substrate with the OLED are limited by fabricating process limitations. Also, if the screen is too large, there is a greater probability of a defect occurring somewhere on the screen. Thus, a reduction in yield is unavoidable, and it is difficult to obtain uniformity across the screen.

As a solution to the above problems of the OLED, a tiling technique has been developed. In the tiling technique, a plurality of EL panels are bonded together like tiles to form a single panel.

Each of the EL panels includes a plurality of pixels to display a predetermined image similar to a conventional OLED. In each of the EL panels, a scan driver applies a scan signal for enabling the pixels, and a data driver applies a data signal to a selected pixel. Also, an emission control driver applies an emission control signal to each of the pixels in order to control the exact programming of the data signal and the time required for an emission operation.

As described above, the scan driver, the data driver, and the emission control driver, which transmit various signals to drive the EL panels, may be electrically connected to each of the EL panels in various manners.

For example, the scan driver, the data driver, and the emission control driver may be mounted as chips on a tape carrier package (TCP) that is bonded and electrically connected to each of the EL panels. Alternatively, the drivers may be mounted as chips on a flexible printed circuit (FPC) or a film that is bonded and electrically connected to each of the EL panels. The latter technique is referred to as a chip-on-flexible board (or chip-on-film) (COF) technique. In another method, the drivers are directly mounted on a glass substrate of the EL panel. This method is referred to as a chip-on-glass (COG) technique. These methods are costly and complicate the modules because the drivers should be separately designed and electrically connected to one another.

To overcome these drawbacks, a system-on-panel (SOP) technique has been recently developed. Also, there have been attempts at designing a pixel portion, scan and emission control drivers, and/or a data driver in each EL panel, for constructing all systems in the EL panels.

In the OLED using the tiling technique, when each EL panel is formed as an SOP type, it is easy to bond the EL panels to one another. The SOP technique reduces the area of the drivers, in addition to the cost and labor associated with designing integrated circuits (ICs) for the drivers.

However, in order to develop the SOP-type OLED, it is necessary to consider many internal circumstances and conditions of the EL panels, such as a driving frequency and electron mobility of the data driver and/or the scan and emission control drivers. It is currently still difficult to design the data driver within a panel because the data driver needs a high driving frequency.

Accordingly, the data driver is formed as an IC using complementary metal oxide semiconductor (CMOS) technology and connected to the EL panel, while the scan driver and/or the emission control driver are formed within the EL panel.

Therefore, there is a need for a simple circuit construction in which a SOP-type scan driver and emission control driver can be optimally driven within the EL panel.

SUMMARY OF THE INVENTION

This invention provides an emission control driver which is designed as a system-on-panel (SOP) type in an electroluminescent (EL) panel and generates emission signals to control the emission of pixels for an organic light emitting display (OLED) device.

Additional features of the invention will be set forth in the description which follows, and in part will be apparent from the description, or may be learned by practice of the invention.

The present invention discloses an organic light emitting display device, which includes a pixel portion having a plurality of pixels for displaying a predetermined image; a scan driver, which applies a scan signal to sequentially select the pixels; a data driver, which applies a data signal to the pixels that are selected by the scan signal; and an emission control driver, which applies an emission signal to control an emission operation of the pixels. The emission control driver includes a shift register including a plurality of flip-flops, wherein the first flip-flop receives a start pulse and the rest of the flip-flops receives an output signal of a previous flip-flop and generate an output signal in synchronization with a clock signal and an inverted clock signal. The emission control driver further includes a logical operation portion including a plurality of logic gates. Each of the logic gates receives first and second output signals and first and second inverted output signals from two adjacent flip-flops. Each of the logic gates also controls an active load using the received signals and outputs an emission control signal through a logical OR operation on the first and second output signals.

The present invention also discloses an emission control driver, which includes a first flip-flop that receives a start pulse and generates a first output signal and a first inverted output signal in synchronization with a clock signal and an inverted clock signal; a second flip-flop, which receives the first output signal and the first inverted output signal of the first flip-flop and generates a second output signal and a second inverted output signal in synchronization with the clock signal and the inverted clock signal; and a plurality of logic gates, each of which receives the first output signal and the first inverted output signal of the first flip-flop and the second output signal and the second inverted output signal of the second flip-flop, controls an active load using the received signals, and generates an emission control signal through a logical OR operation on the output signals of the first and second flip-flops.

Each of the first and second flip-flops may include a first transistor, which samples an input signal on a falling edge of the inverted clock signal; a first inverter, which inverts an output signal of the first transistor; a second inverter, which samples an output signal of the first inverter on a falling edge of the clock signal; and a second inverter, which inverts an output signal of the second transistor.

The present invention also discloses a logical OR circuit that comprises an input portion, which is connected to a first power supply voltage and is turned on and off according to the levels of a first input signal and a second input signal; a first active load, which includes a first transistor connected between the input portion and a second power supply voltage and selectively diode-connected according to the level of one of a first inverted input signal and a second inverted input signal; an output transistor connected between the first power supply voltage and an emission control line and turned on and off according to the level of an output signal of one of the input portion and the first active load; and a second active load comprising a second transistor connected between the second power supply voltage and the emission control line and selectively diode-connected according to the levels of the first and second input signals.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
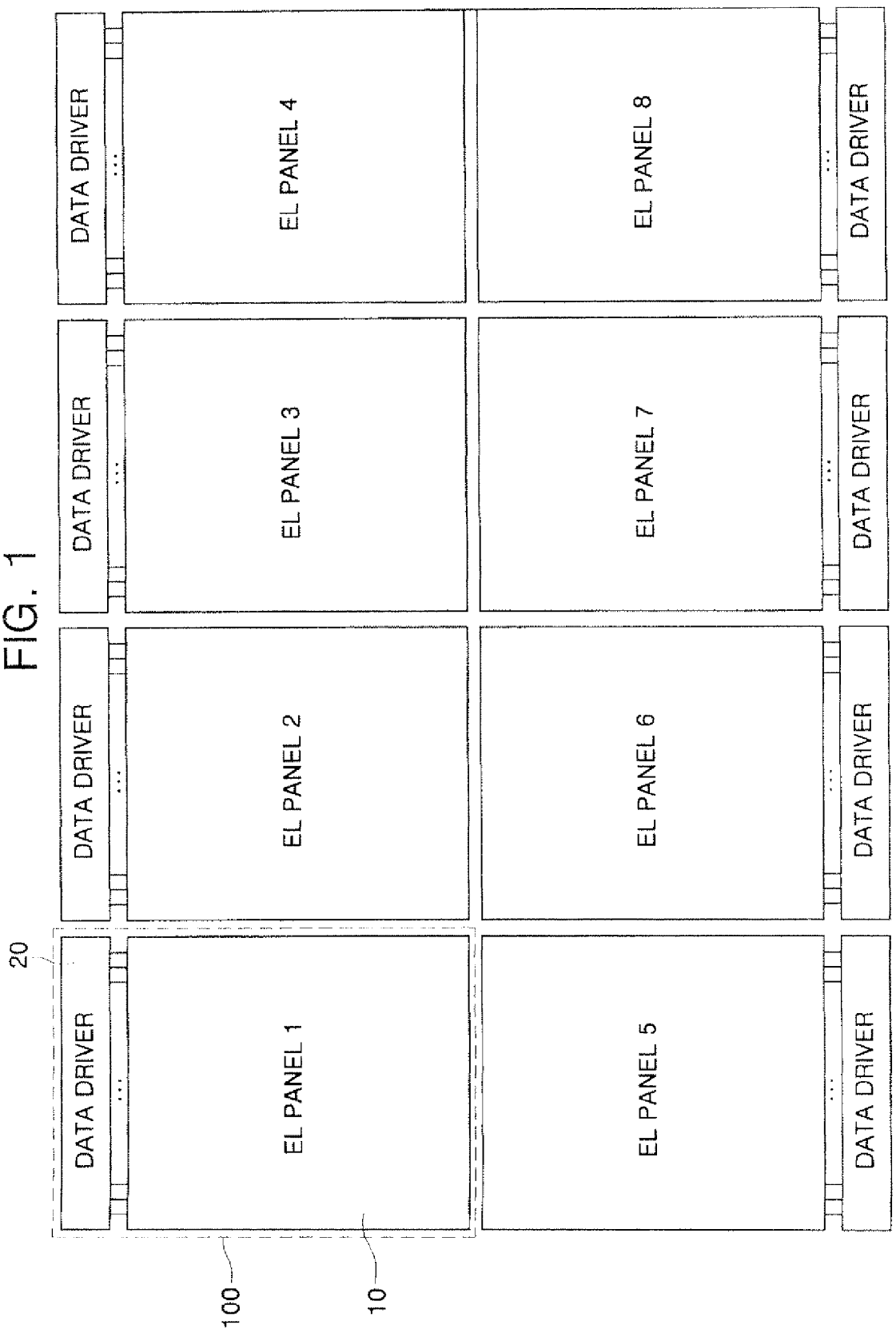
FIG. 1 is a block diagram of an organic light emitting display (OLED) device using a tiling technique according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

FIG. 1 is a block diagram of an organic light emitting display (OLED) device using a tiling technique according to an exemplary embodiment of the present invention.

Referring to FIG. 1, the OLED device, which may be designed to various sizes, is formed by bonding a plurality of OLED arrays 100. FIG. 1, illustrates eight OLED arrays 100, which are disposed in two rows and four columns and are bonded to one another.

Each of the OLED arrays 100 includes an electroluminescent (EL) panel 10, which displays a predetermined image, and a data driver 20, which supplies a data signal to the EL panel 10.

The EL panels 10 each have a similar construction. The edges of the EL panels 10 are bonded to one another using an adhesive to form a combined EL panel. The adhesive may be an ultraviolet (UV)-curing resin or a thermal curing resin, for example, an epoxy resin.

Each of the EL panels 10 may be produced by the same fabricating process used for the production of an EL panel of a conventional OLED array. Accordingly, a large-sized EL panel may be fabricated by bonding a plurality of EL panels that are produced by the same fabricating process.

Figure 2:
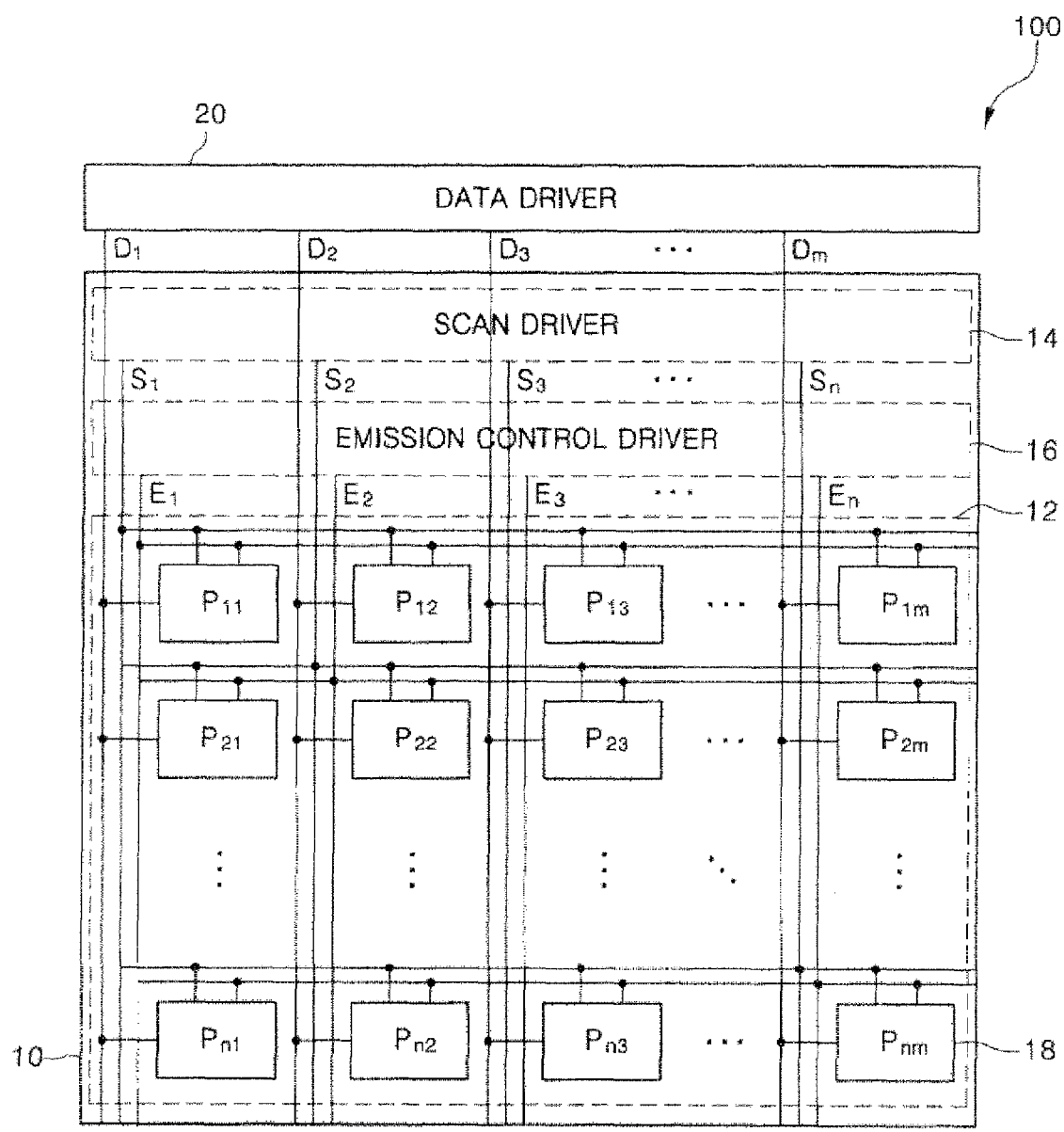
FIG. 2 is a detailed block diagram of an OLED array shown in FIG. 1.

Each of the EL panels 10, as shown in FIG. 2, includes a scan driver (14); an emission control driver (16); and a plurality of pixels (18). Each of the drivers and pixels includes a thin film transistor (TFT), which are well known in the art, which has a polysilicon channel in order to obtain fast response speed and high uniformity. In this case, the polysilicon channel may be formed by forming an amorphous silicon (a-Si) layer on a glass substrate and crystallizing the a-Si layer using a low temperature polysilicon (LTPS) process.

A plurality of polysilicon TFTs may be formed using the LTPS process. Thereafter, the pixel portion, the scan driver, and the emission control driver may be formed using the transistors in each of the EL panels 10. The pixel portion is comprised of red (R), green (G), and blue (B) sub-pixels, and the scan and emission control drivers select respective pixels and generate signals for controlling an emission operation of the selected respective pixels. A detailed description of the EL panel 10 will be presented later.

Each data driver 20, as shown in FIG. 2, is designed as an external integrated circuit (IC) using complementary metal oxide semiconductor (CMOS) technology and electrically connected to the corresponding EL panel 10. The EL panel 10 is electrically connected to the data driver 20 using a metal pattern that is printed on a flexible film. That is, an output terminal of the data driver 20 is electrically connected to one end of the metal pattern, and a data line disposed on the EL panel 10 is electrically connected to the other end thereof. This method is referred to as a tape carrier package (TCP) technique. Each of the data drivers 20 transmits a data signal to the pixel portion of the EL panel 10 through a plurality of conductive lines that are disposed on the flexible film.

FIG. 2 is a detailed block diagram of the OLED array shown in FIG. 1.

Referring to FIG. 2, the OLED array 100 includes an EL panel 10 and a data driver 20.

The EL panel 10 includes a pixel portion 12, a scan driver 14, and an emission control driver 16.

The pixel portion 12 includes a plurality of data lines $D_1$-$D_m$, a plurality of scan lines $S_1$-$S_n$, a plurality of emission control lines $E_1$-$E_n$, and a plurality of pixel circuits $P_{11}$-$P_{nm}$ (18), that are formed in regions where the data lines $D_1$-$D_m$, the scan lines $S_1$-$S_n$, and the emission control lines $E_1$-$E_n$ intersect one another.

The data lines $D_1$-$D_m$ are electrically connected to the data driver 20 and extend in a vertical direction. The data lines $D_1$-$D_m$ transmit data signals to the respective pixels $P_{11}$-$P_{nm}$.

Unlike a conventional OLED device, the scan lines $S_1$-$S_n$ and the emission control lines $E_1$-$E_n$ extend in the same direction as the data lines $D_1$-$D_m$ (i.e., in the vertical direction). However, each of the scan $S_1$-$S_n$ and emission $E_1$-$E_n$ control lines and includes a contact hole in order to transmit the same scan and emission control signals to the pixels arranged in a horizontal direction. Therefore, metal interconnections, which contact the scan $S_1$-$S_n$ and emission $E_1$1-$E_n$ control lines through the contact holes, extend in a horizontal direction so that scan and emission control signals are transmitted to the pixels arranged in the horizontal direction.

Each of the pixels $P_{11}$-$P_{nm}$ includes R, G, and B sub-pixels that are repeatedly arranged in rows and columns. The R, G, and B sub-pixels used for an organic emission layer to emit light are formed from different organic materials, but are otherwise similar to one another with respect to the interconnection layout and circuit connection of their respective driving circuits. Accordingly, each of the pixels $P_{11}$-$P_{nm}$ emits R, G, or B light with luminance corresponding to a data signal applied thereto and combines the R, G, and B light to display a specific color. The circuit construction of each of the pixels $P_{11}$-$P_{nm}$ will be described with reference to FIG. 3 and FIG. 4.

Figure 3:
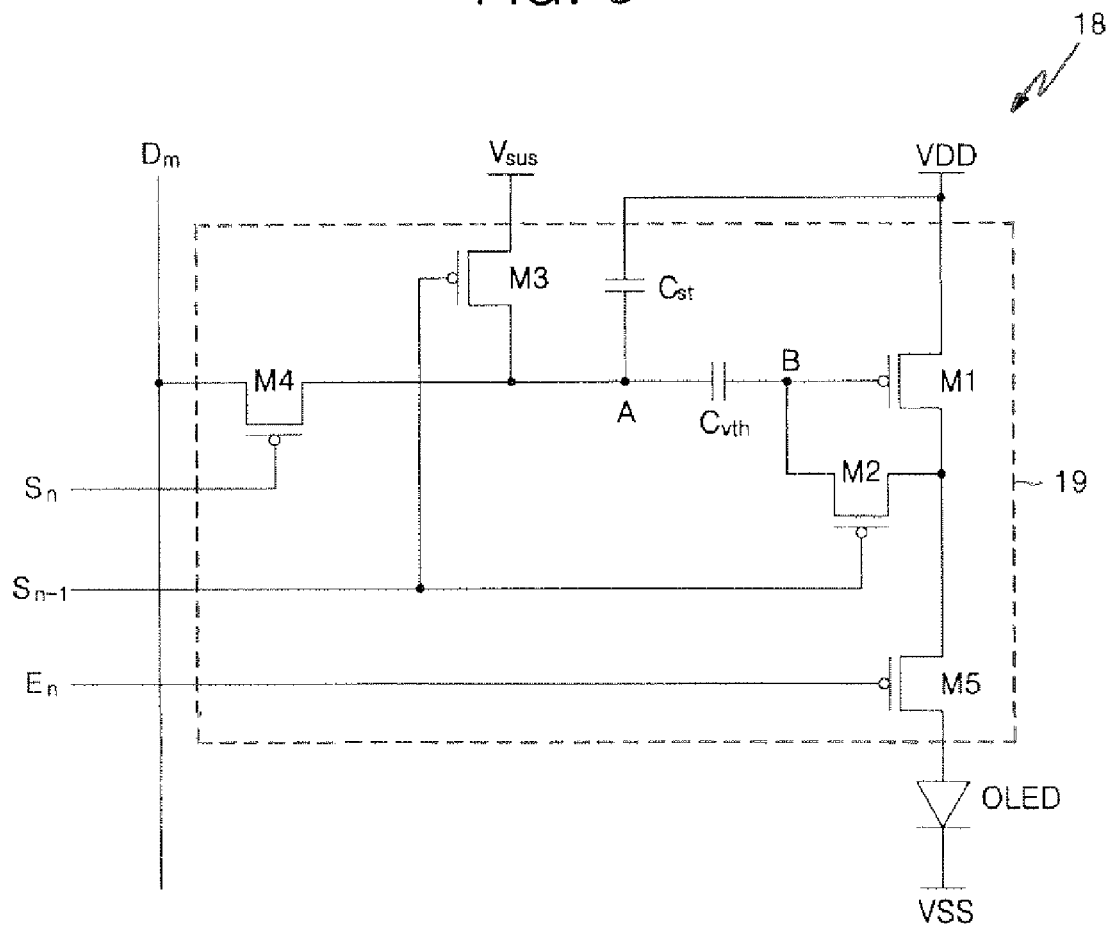
FIG. 3 is a circuit diagram of a pixel of a pixel portion shown in FIG. 2.

FIG. 3 is a circuit diagram for one of the pixels $P_{11}$-$P_{nm}$ of the pixel portion shown in FIG. 2.

Referring to FIG. 3, a pixel circuit 18 includes a pixel driver 19 and an organic light emitting diode OLED.

The pixel driver 19 is connected to a data line $D_m$, a previous scan line $S_{n-1}$, a current scan line $S_n$, an emission control line $E_n$, a first power supply voltage line VDD, and a second power supply voltage line $V_{SUS}$. The pixel driver 19 receives a data signal $V_{DATA}$ from the data line $D_m$ and supplies a driving current $I_{OLED}$ corresponding to the data signal $V_{DATA}$ to the organic light emitting diode OLED.

The organic light emitting diode OLED includes an anode electrode, a cathode electrode, and an organic emission layer. The anode electrode is connected to the pixel driver 19, and the cathode electrode is connected to a reference power supply voltage line VSS. The organic light emitting diode OLED receives the driving current from the pixel driver 19 and emits light at a luminance corresponding to the amount of driving current $I_{OLED}$.

The pixel driver 19 includes five transistors M1-M5 and two capacitors $C_{st}$ and $C_{vth}$. The configuration of the pixel driver 19 will now be described.

The switching transistor M4 has a source terminal connected to the data line $D_m$, and a gate terminal connected to the current scan line $S_n$. The switching transistor M4 is turned on in response to a scan signal applied from the scan line $S_n$ and transmits the data signal $V_{DATA}$ applied from the data line $D_m$.

The driving transistor M1 has a source terminal connected to the first power supply voltage line VDD and generates a driving current $I_{OLED}$ corresponding to a voltage applied to a gate terminal thereof.

The threshold voltage compensation transistor M2 is connected between the gate terminal and a drain terminal of the driving transistor M1. The threshold voltage compensation transistor M2 is turned on in response to a previous scan signal transmitted via the previous scan line $S_{n-1}$, and compensates a threshold voltage $V_{TH}$ of the driving transistor The first capacitor $C_{vth}$ is connected between a drain terminal of the switching transistor M4 and the gate terminal of the driving transistor M1. The first capacitor $C_{vth}$ stores a voltage corresponding to the threshold voltage $V_{TH}$ of the driving transistor M1.

The second capacitor $C_{st}$ is connected between the first power supply voltage line VDD and one terminal of the first capacitor $C_{vth}$ and stores a data voltage $V_{DATA}$ transmitted from the data line $D_m$.

The second power supply voltage application transistor M3 has a source terminal connected to the second power supply voltage line $V_{SUS}$, and a drain terminal connected to a connection point between the first and second capacitors $C_{vth}$ and $C_{st}$. The second power supply voltage application transistor M3 is turned on in response to the previous scan signal $S_{n-1}$ applied to a gate terminal thereof, thus the second power supply voltage $V_{SUS}$ is applied to the connection point between the first and second capacitors $C_{vth}$ and $C_{st}$.

The emission control transistor M5 is connected between the drain terminal of the driving transistor M1 and the anode electrode of the organic light emitting diode OLED. The emission control transistor M5 is turned on/off in response to an emission control signal $E_n$ applied to a gate terminal thereof, so that the driving current $I_{OLED}$ from the driving transistor M1 is supplied to the organic light emitting diode OLED or cut off.

Hereinafter, the operation of the pixel circuit 18 will be described with reference to FIG. 4.

Figure 4:
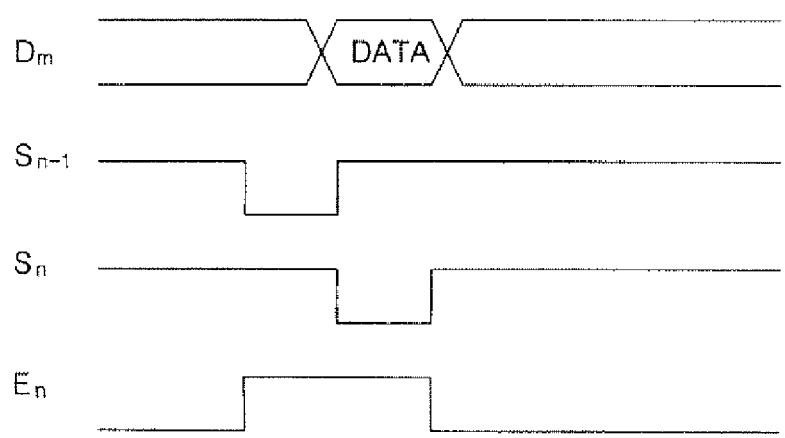
FIG. 4 is a timing diagram illustrating the operation of a pixel circuit shown in FIG. 3.

FIG. 4 is a timing diagram illustrating the operation of the pixel circuit shown in FIG. 3.

Referring to FIG. 3 and FIG. 4, first, once a low-level previous scan signal $S_{n-1}$, a high-level current scan signal $S_n$, and a high-level emission control signal $E_n$ are applied to the pixel circuit 18, the threshold voltage compensation transistor M2 and the second power supply voltage application transistor M3 are turned on, and the other transistors M4 and M5 are turned off. Thus, the driving transistor M1 is diode-connected so that a voltage of VDD−|$V_{TH}$| is applied to one electrode B of the first capacitor $C_{vth}$. Also, the second power supply voltage application transistor M3 is turned on so that a voltage of $V_{SUS}$ is applied to the other electrode A of the first capacitor $C_{vth}$. Accordingly, the first capacitor $C_{vth}$ stores a voltage difference of $V_{SUS}-VDD+|V_{TH}|$.

Thereafter, a low-level current scan signal $S_n$, a high-level previous scan signal $S_{n-1}$, and a high-level emission control signal $E_n$ are applied to the pixel circuit 18, thus only the switching transistor M4 is turned on. In this case, the data voltage $V_{DATA}$ is transmitted from the data line $D_m$ through the switching transistor M4 to the other electrode A of the first capacitor $C_{vth}$. Thus, the other electrode A of the first capacitor $C_{vth}$ has a voltage variation $\Delta V=V_{SUS}-V_{DATA}$, and the one electrode B of the first capacitor $C_{vth}$ also has the same voltage variation as the other electrode A thereof. As a result, a voltage applied to the one electrode B of the first capacitor $C_{vth}$ and the gate terminal of the driving transistor M1 is $VDD-|V_{TH}|-\Delta V=VDD-|V_{TH}|-V_{SUS}+V_{DATA}$.

Finally, a high-level previous scan signal $S_{n-1}$, a high-level current scan signal $S_n$, and a low-level emission control signal $E_n$ are applied to the pixel circuit 18, thus only the emission control transistor M5 is turned on. In this case, the driving current $I_{OLED}$ supplied from the driving transistor M1 can be expressed as shown in Equation 1:

$$I_{OLED}=k(Vgs-|Vth|)^2=k\{VDD-(VDD-|Vth|-V_{SUS}+Vdata)-|Vth|\}^2=k(Vdata-V_{SUS})^2, \quad (1),$$

where $|V_{TH}|$ refers to an absolute value of a threshold voltage of the driving transistor M1, and k is a constant.

As can be seen from Equation 1, the pixel circuit 18 shown in FIG. 3 can compensate the threshold voltage $V_{TH}$ caused by the first power supply voltage VDD.

Referring to FIG. 2 again, the scan driver 14 is disposed between the data driver 20 and the pixel portion 12. Since a large-sized panel is formed by bonding a plurality of EL panels 10, the scan driver 14 should be formed on the same side as the data driver 20. The scan driver 14 is connected to a plurality of scan lines $S_1$-$S_n$. Thus, the scan driver 14 sequentially transmits scan signals to the pixel portion 12 and sequentially selects each of the pixels $P_{11}$-$P_{nm}$.

The emission control driver 16 is disposed between the scan driver 14 and the pixel portion 12, and connected to a plurality of emission control lines $E_1$-$E_n$. Thus, the emission control driver 16 sequentially transmits emission control signals to the pixel portion 12 and controls an emission time of each of the pixels $P_{11}$-$P_{nm}$.

The data driver 20 transmits a data signal to the pixel portion 12 of the EL panel 10 through a plurality of conductive lines disposed on the flexible film as described above.

According to the present invention as described above, the OLED array 100 includes the EL panel 10 and the data driver 20, where the EL panel 10 includes the pixel portion 12, the scan driver 14, and the emission control driver 16. Hereinafter, the structure and operation of the emission control driver 16 will be described in detail with reference to exemplary embodiments of the present invention.

Figure 5:
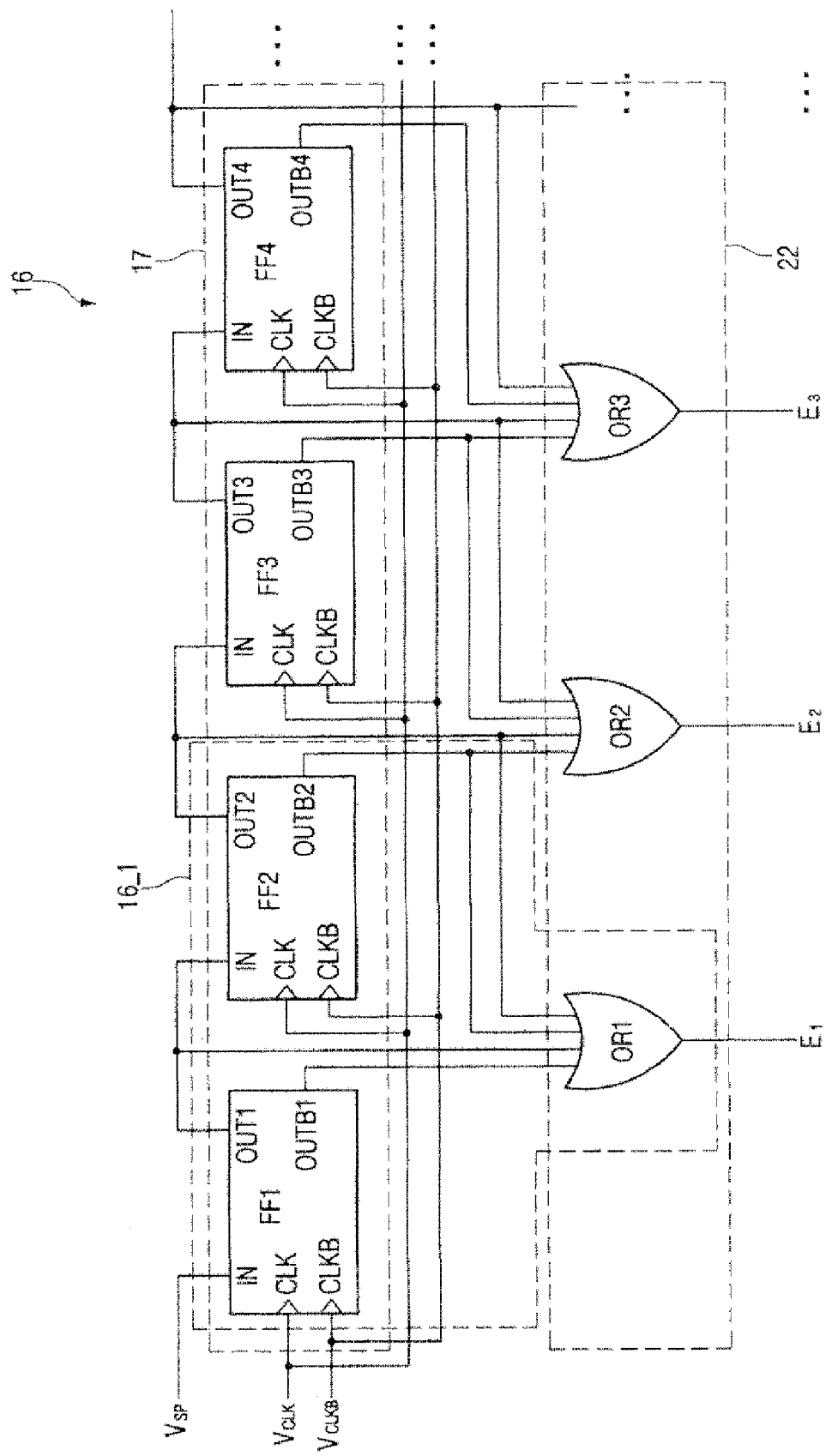
FIG. 5 is a block diagram of an emission control driver of an organic EL panel according to the exemplary embodiment of the present invention.

FIG. 5 is a block diagram of an emission control driver of an organic EL panel according to the exemplary embodiment of the present invention.

Referring to FIG. 5, the emission control driver 16 includes a shift register 17 and a logical operation portion 22. The shift register 17 is connected to a plurality of flip-flops FF1, FF2, FF3, FF4, . . . shifting an input signal by one clock cycle and outputting the shifted signal. The logical operation portion 22 includes a plurality of logic gates OR1, OR2, OR3, . . . which receive output signals from the adjacent flip-flops FF1, FF2, FF3, and FF4 and generate emission control signals through logical OR operations for the received signals.

The first flip-flop FF1 receives a start pulse $V_{SP}$, a clock signal $V_{CLK}$, and an inverted clock signal $V_{CLKB}$, samples the start pulse $V_{SP}$ at a falling edge of the clock signal $V_{CLK}$ and maintains the sampled signal for a clock cycle, and outputs an output signal OUT1 and an inverted output signal OUTB1.

The second flip-flop FF2 receives the output signal OUT1 of the first flip-flop FF1, the clock signal $V_{CLK}$, and the inverted clock signal $V_{CLKB}$, shifts the received signal for one cycle of the clock signal $V_{CLK}$, samples the shifted signal at a falling edge of the next cycle of the clock signal $V_{CLK}$ and maintains the sampled signal for a clock cycle, and outputs an output signal OUT2 and an inverted output signal OUTB2.

Thereafter, the third, fourth, . . . flip-flops FF3, FF4, . . . perform the same operations as the first and second flip-flops FF1 and FF2 and output shifted signals. The flip-flops FF1, FF2, FF3, FF4, . . . may have the same construction, which will be described in detail later.

The logical operation portion 22 includes a plurality of logic gates OR1, OR2, OR3, . . . each of which is connected to an emission control line and transmits an emission control signal to each of the pixels.

The first logic gate OR1 receives the output signals OUT1 and OUTB1 from the first flip-flop FF1 and the output signals OUT2 and OUTB2 from the second flip-flop FF2. The first logic gate OR1 performs a logical OR operation on the output signals OUT1, OUTB1, OUT2, and OUTB2. Unlike a typical logic gate, the first logic gate OR1 of the present invention outputs a low-level emission control signal $E_1$, only when the output signals OUT1 and OUT2 of the first and second flip-flops FF1 and FF2, respectively, are at low levels and the inverted output signals OUTB1 and OUTB2 of the first and second flip-flops FF1 and FF2, respectively, are at high levels; and outputs a high-level emission control signal $E_1$ in all other cases.

Next, the second logic gate OR2 receives the output signals OUT2 and OUTB2 of the second flip-flop FF2 and output signals OUT3 and OUTB3 of the third flip-flop FF3, performs the same logical OR operation as the first logic gate OR1, and outputs a second emission control signal $E_2$.

Like the first and second logic gates OR1 and OR2, each of the third logic gate OR3 through an n-th logic gate ORn performs a logical OR operation for four input signals, and outputs each of emission control signals $E_3$-$E_n$. The logic gates OR1 through ORn may have the same construction, which will be described in detail later.

As described above, the emission control driver of the present invention includes the shift register 17 and the logical operation portion 22, and a connection of the two flip-flops FF1 and FF2 adjacent to the shift register 17 with the single logic gate OR1 of the logical operation portion 22 is defined as a basic emission control driving circuit 16_1, which generates the emission control signal $E_1$. The foregoing operating principle of the emission control driver shown in FIG. 5 will be described in detail later with reference to a timing diagram.

Figure 6:
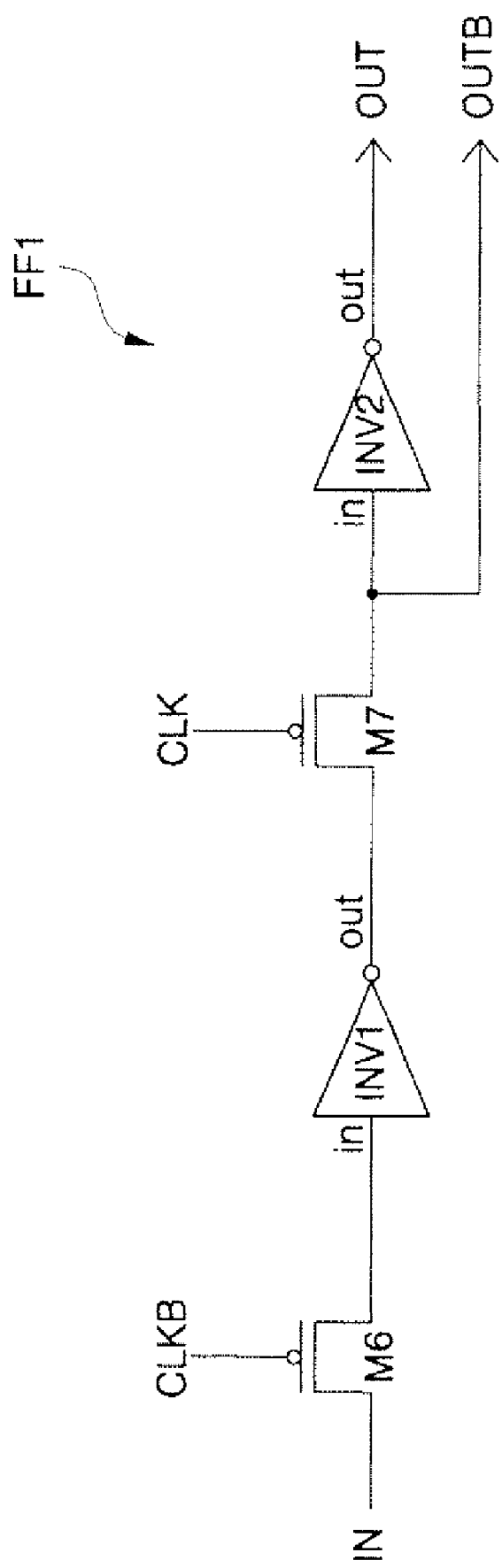
FIG. 6 is a circuit diagram of a flip-flop of a shift register of the emission control driver shown in FIG. 5.

FIG. 6 is a circuit diagram of a representative flip-flop (i.e., the first flip-flop FF1) of the shift register of the emission control driver shown in FIG. 5.

Referring to FIG. 6, the flip-flop FF1 includes two switching transistors M6 and M7 and two inverters INV1 and INV2. More specifically, the flip-flop FF1 is controlled by an inverted clock signal CLKB and includes the transistors M6 and M7 and the first and second inverters INV1 and INV2. The transistor M6 samples an input signal IN at a falling edge of the inverted clock signal CLKB, and the first inverter INV1 inverts an output signal of the transistor M6. The transistor M7 samples an output signal of the first inverter INV1 at a falling edge of a clock signal CLK, and the second inverter INV2 inverts an output signal of the transistor M7. Here, the transistors M6 and M7 are positive channel metal oxide semiconductors (PMOS) transistors.

Accordingly, when an input signal IN is applied to the transistor M6 and the inverted clock signal CLKB makes a high-to-low transition, the transistor M6 samples the input signal IN and transmits the sampled signal to the first inverter INV1. In response to a falling edge of the clock signal CLK, the transistor M7 is turned on, and the first inverter INV1 inverts the sampled signal and outputs the inverted signal. An output signal OUTB of the first inverter INV1 is transmitted from the transistor M7, inverted again by the second inverter INV2, and output as an output signal OUT.

As described above, the flip-flop FF1 according to the present invention makes use of the input signal IN, the clock signal CLK, and the inverted clock signal CLKB to generate a desired output signal. The input signal OUTB1 and output signal OUT1 of the second inverter INV2 are input as two input signals of the foregoing logic gate OR1. Also, the output signal OUT of the second inverter INV2 is input to the next flip-flop FF2, and the next flip-flop FF2 makes use of the input signal OUT1, the clock signal CLK, and the inverted clock signal CLKB shifted by a clock cycle, to generate a desired output signal OUT2 and OUTB2, and then OUT1, OUT2, OUTB1 and OUTB2 input as an input signal of the logic gate OR1. Accordingly, the input signals OUT1, OUT2, OUTB1 and OUTB2 of logic gate OR1 is selected from the flip-flop FF1 and FF2 without additional signals, so that power consumption may be reduced.

Hereinafter, the construction of the first and second inverters INV1 and INV2 used for the flip-flop FF1 will be described.

Figure 7:
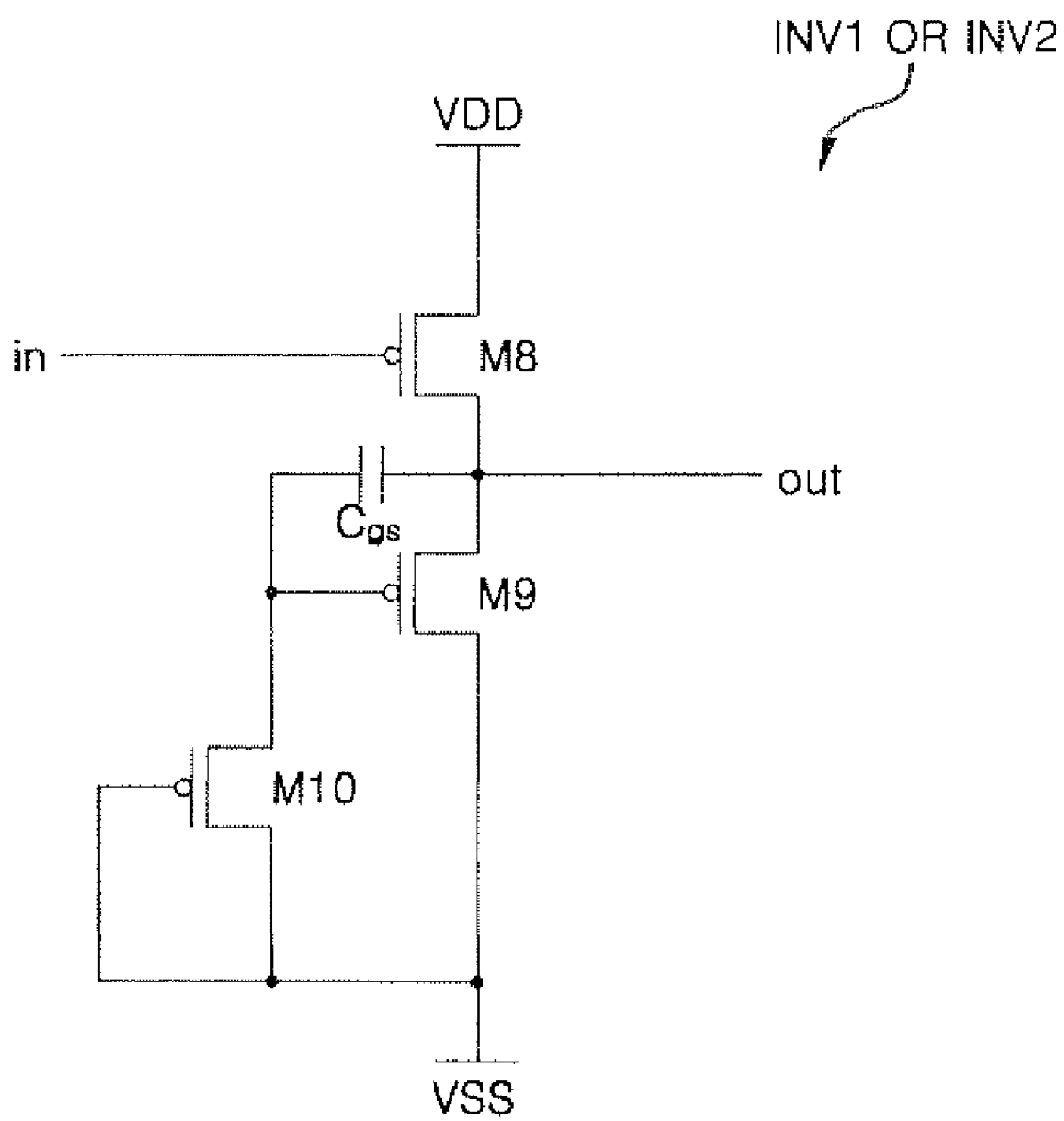
FIG. 7 is a detailed circuit diagram of an inverter of the flip-flop shown in FIG. 6.

FIG. 7 is a detailed circuit diagram of an inverter of the flip-flop shown in FIG. 6.

Since the first and second inverters INV1 and INV2 have the same construction, only the construction of the first inverter INV1 will be described for convenience.

Referring to FIG. 7, the inverter INV1 includes three PMOS transistors M8, M9, and M10.

The transistor M8 has a source terminal connected to a first power supply voltage VDD, a gate terminal connected to an output terminal of the transistor M6 of the flip-flop FF1 and a drain terminal connected to an output terminal "out". The output terminal "out" is connected to an input terminal of the transistor M7 of the flip-flop FF1. Accordingly, the transistor M8 is turned on/off in response to an input signal "in" transmitted from the transistor M6 and outputs the first power supply voltage VDD to the output terminal "out" or cuts off the first power supply voltage VDD. Here, the first power supply voltage VDD is a positive power supply voltage, for example, 5 V.

The transistor M9 has a source terminal connected to the drain terminal of the transistor M8 and the output terminal "out", and a drain terminal connected to a second power supply voltage VSS. Thus, the transistor M9 acts as an active load according to a voltage applied to a gate terminal thereof.

Also, the transistor M10 is connected between the gate and drain terminals of the transistor M9, has a gate terminal and a drain terminal, which are diode-connected, and controls a gate voltage of the transistor M9. Here, the second power supply voltage VSS is a negative power supply voltage, for example, –7 V. Accordingly, the transistor M9 acts as an active load and always remains turned on according to a difference between a voltage applied to the source terminal and a voltage applied to the gate terminal. Preferably, a channel width over a channel length W/L of the transistor M9 is smaller that that of the transistor M8. In this case, when the transistor M8 is turned on, turned-on resistance of the transistor M9 may be higher than that of the transistor M8.

Furthermore, the inverter INV1 may further include a capacitor $C_{gs}$, which is connected between the source and gate terminals of the transistor M9 and maintains a voltage $V_{gs}$ between the source and gate terminals of the transistor M9 when the transistor M10 is turned off.

The operating principle of the above-described inverter INV1 will now be explained.

First, when an input signal of low-level (–7 V) "in" is applied to the gate terminal of the transistor M8, the transistor M8 is turned on, and the transistors M9 and M10 are also turned on. However, since the transistor M9 has a higher on-resistance than the transistor M8, a voltage at the output terminal "out" substantially becomes the first power supply voltage VDD, i.e., a high-level voltage of 5 V.

Next, once an input signal of high-level (5 V) "in" is applied to the gate terminal of the transistor M8, the transistor M8 is turned off, and the transistors M9 and M10 remain turned on. Thus, a voltage at the output terminal "out" is gradually transitioned from the high-level voltage of 5 V to a low level. In this case, the transistor M10 is turned off so that the output terminal "out" has low level. Accordingly, a voltage $V_{gs}$ between the source and gate terminals of the transistor M9 is maintained at a constant level, and a voltage at the output terminal "out" connected to the source terminal of the transistor M9 makes a downward transition to the second power supply voltage VSS, i.e., a low-level voltage of –7 V. In this case, as the voltage at the output terminal "out" decreases, the gate voltage of the transistor M9 also makes a transition to –7 to –15 V.

As described above, the flip-flop of the present invention can sample an input signal and output a desired output signal in response to variations in the levels of a clock signal CLK and an inverted clock signal CLKB. Thus, output signals OUT1, OUTB1, OUT2, and OUTB2 of the adjacent flip-flops FF1 and FF2 are transmitted to input terminals of the logic gate OR1.

Hereinafter, the logic gate OR1 to which the output signals OUT1, OUTB1, OUT2, and OUTB2 of the adjacent flip-flops FF1 and FF2 are applied will be described in detail.

Figure 8:
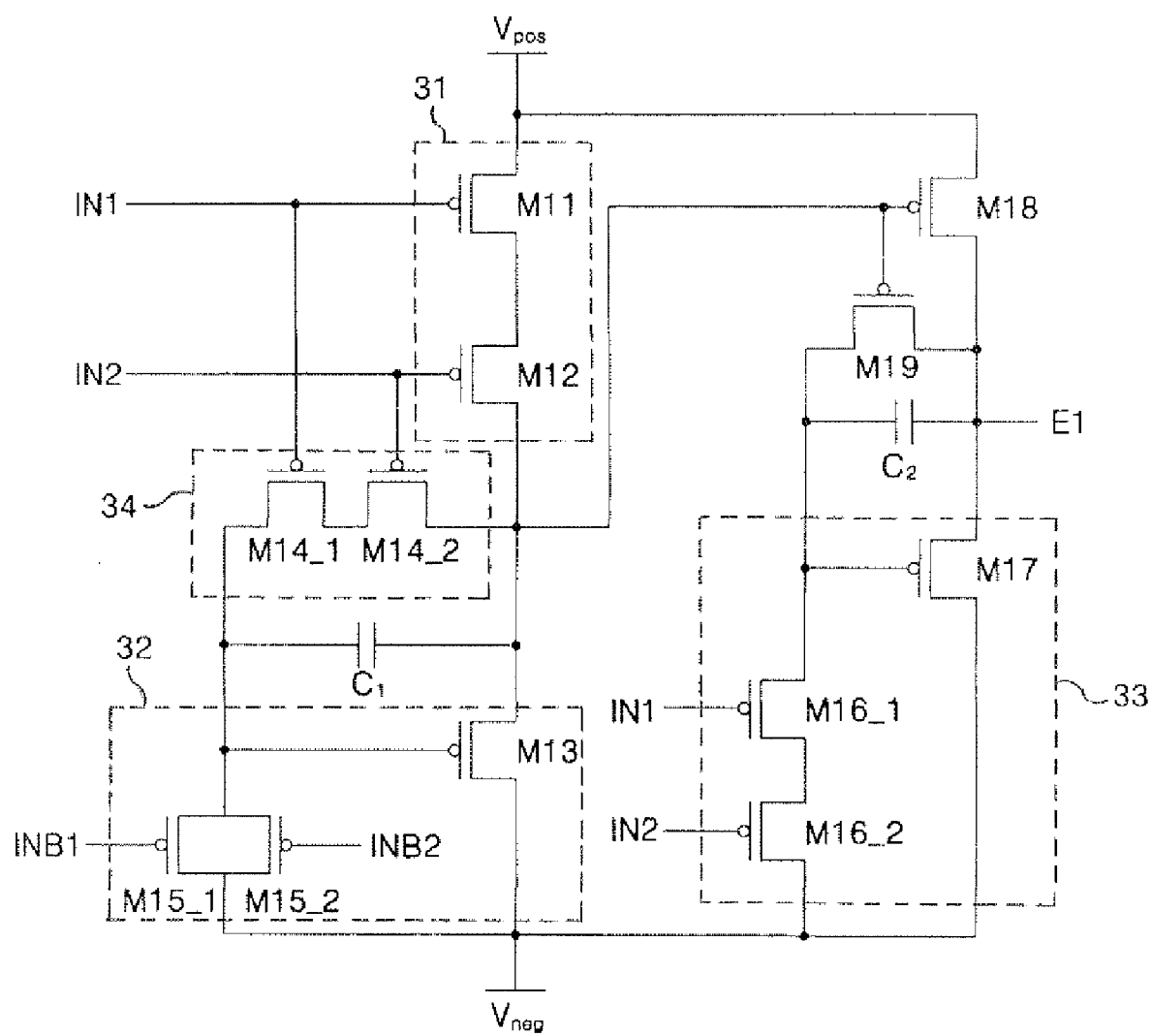
FIG. 8 is a detailed circuit diagram of a logic gate of a logical operation portion of the emission control driver shown in FIG. 5.

FIG. 8 is a detailed circuit diagram of one of a plurality of logic gates of the logical operation portion of the emission control driver shown in FIG. 5.

Referring to FIG. 8, the logic gate includes an input portion 31, a first active load 32, an output transistor M18, and a second active load 33. The input portion 31 is turned on/off in response to two input signals IN1 and IN2. The first active load 32 has a transistor M13 which is connected to the input portion 31 and selectively diode-connected in response to two inverted input signals INB1 and INB2. The output transistor M18 receives an output signal of the input portion 31 and is turned on/off in response to the level of the input signal. The second active load 33 has a transistor M17 which is connected to the output transistor M18 and selectively diode-connected in response to the two input signals IN1 and IN2.

Also, the logic gate further includes a switching portion 34, a first capacitor C1, and a second capacitor C2. The switching portion 34 is turned on/off in response to the input signals IN1 and IN2 and turns off the transistor M13 when the input signals IN1 and IN2 are at low levels. The first capacitor C1 maintains a voltage between a source terminal and a gate terminal of the transistor M13, and the second capacitor C2 maintains a voltage between a source terminal and a gate terminal of the transistor M17.

Further, the logic gate further includes a transistor M19 connected to both ends of the second capacitor C2. The transistor M19 is turned on/off in response to an output signal of the input portion 31 and turns off the transistor M17 when the output signal is at a high level.

Here, an input signal IN1 and an inverted input signal INB1 respectively correspond to an output signal OUT1 and an inverted output signal OUTB1 of the flip-flop FF1, and an input signal IN2 and an inverted input signal INB2 respectively correspond to an output signal OUT2 and an inverted output signal OUTB2 of the flip-flop FF2.

Specifically, the input portion 31 includes a transistor M11 and a transistor M12. The transistor M11 is connected to a positive power supply voltage $V_{POS}$ and turned on/off according to the level of the input signal IN1. The transistor M12 is connected to the transistor M11 and turned on/off according to the level of the input signal IN2. Thus, the input portion 31 is turned on only when both the input signals IN1 and IN2 are at low levels and outputs the positive power supply voltage $V_{POS}$, and turned off in all other cases.

The first active load 32 includes a transistor M13 and a pair of transistors M15_1 and M15_2. The transistor M13 is connected between the transistor M12 and a negative power supply voltage $V_{neg}$ and diode-connected according to the level of the inverted input signals INB1 and INB2. Each of the transistors M15_1 and M15_2 is connected between a gate terminal and a drain terminal of the transistor M13 and turned on/off according to the level of the inverted input signals INB1 and INB2. Accordingly, the transistor M13 is diode-connected except in the case where both the input signals INB1 and INB2 are at high levels and applies a voltage corresponding to the sum of the negative power supply voltage $V_{neg}$ and a threshold voltage $V_{THM13}$ to an output terminal of the input portion 31.

The output transistor M18 is connected between the positive power supply voltage $V_{POS}$ and an emission control line E1 and has a gate terminal connected to output terminals of the input portion 31 and the first active load 32 so that it is turned on/off in response to a voltage applied to the gate terminal. Thus, when the voltage applied to the gate terminal is at a low level, the transistor M18 is turned on and transmits the positive power supply voltage $V_{POS}$ to the emission control line E1.

The second active load 33 includes a transistor M17 and a pair of transistors M16_1 and M16_2. The transistor M17 is connected between the transistor M18 and the negative power supply voltage $V_{neg}$ and diode-connected according to the level of the input signals IN1 and IN2. Each of the transistors M16_1 and M16_2 is connected between a gate terminal and a drain terminal of the transistor M17 and turned on/off according to the level of the input signals IN1 and IN2. Thus, only when both the input signals IN1 and IN2 are at low levels, the transistor M17 is diode-connected and transmits a voltage corresponding to the sum of the negative power supply voltage $V_{neg}$ and absolute value of a threshold voltage $V_{THM17}$ to the emission control line E1.

Also, the switching portion 34 includes two transistors M14_1 and M14_2, which are connected in series. Each of the transistors M14_1 and M14_2 is connected between the source and gate terminals of the transistor M13 of the first active load 32 and turned on/off in response to the input signals IN1 and IN2. When both the input signals IN1 and IN2 are at low levels, the switching portion 34 drives a voltage difference $V_{gsM13}$ between the source and gate terminals of the transistor M13 to 0 V so that the transistor M13 is turned off. Accordingly, when the input portion 31 is turned on, the flow of static current through the first active load 32 can be prevented.

Further, the transistor M19 is connected between the source and gate terminals of the transistor M17 of the second active load 33 and turned on/off in response to the output signal of the first input portion 31. Thus, when the output signal of the first input portion 31 is at a low level, the transistor M19 drives a voltage difference $V_{gsM17}$ between the source and gate terminals of the transistor M17 to 0 V so that the transistor M17 is turned off. Accordingly, when the transistor M18 is turned on, the flow of static current through the second active load 33 can be prevented.

Here, all transistors of the logic gate are PMOS transistors. But, it would be apparent to those skilled in the art that all transistors of the logic gate may be negative channel metal oxide semiconductor (NMOS) transistors. That is, by replacing the PMOS transistors with NMOS transistors and changing the positive power supply voltage $V_{POS}$ to the negative power supply voltage $V_{neg}$, a logic gate comprised of NMOS transistors may be designed.

The emission control signal E1 is output from the above-described logic gate according to the levels of the input signals IN1 and IN2 and the inverted input signals INB1 and INB2 as will be explained now.

First, when both the input signals IN1 and IN2 are at low levels and both the inverted input signals INB1 and INB2 are at high levels, both the transistors M11 and M12 of the input portion 31 are turned on, and both the transistors M14_1 and M14_2 of the switching portion 34 are also turned on. Also, both the transistors M16_1 and M16_2 of the second active load 33 are turned on. But, the transistors M15_1 and M15_2 of the first active load 32 are turned off.

Accordingly, the positive power supply voltage $V_{POS}$ is transmitted from the input portion 31 to the gate terminals of the output transistor M18 and the transistor M19. In this case, the switching portion 34 is turned on and drives a source-gate voltage $V_{gsM13}$ of the transistor M13 of the first active load 32 to 0 V. As a result, the transistor M13 is turned off, thus no static current flows in the first active load 32. Meanwhile, the output transistor M18 and the transistor M19 to which the positive power supply voltages $V_{POS}$ are applied are turned off, and the transistor M17, which is diode-connected to the second active load 33, outputs an emission control signal at a low level corresponding to the sum of the negative power supply voltage $V_{neg}$ and absolute value of the threshold voltage $V_{THM17}$.

Thereafter, when the input signal IN1 is at a high level and the input signal IN2 is at a low level or when the input signal IN1 is at a low level and the input signal IN2 is at a high level, the logic gate is in the following state.

Any one of the transistors M11 and M12 of the input portion 31 is turned off, and any one of the transistors M14_1 and M14_2 of the switching portion 34 is also turned off. Also, any one of the transistors M16_1 and M16_2 of the second active load 33 is turned off. But, any one of the parallel-connected transistors M15_1 and M15_2 of the first active load 32 is turned on.

Accordingly, the input portion 31 and the switching portion 34 are turned off, and the transistor M13 of the first active load 32 is diode-connected, thus a voltage at the gate terminal of the output transistor M18 is reduced to a low level corresponding to the sum of the negative power supply voltage $V_{neg}$ and absolute value of the threshold voltage $V_{THM13}$. The output transistor M18 to which a low-level voltage is applied is turned on and applies the positive power supply voltage $V_{POS}$ to the emission control line E1. In this case, the transistor M19 is turned on and drives the source-gate voltage $V_{gsM17}$ of the transistor M17 of the second active load 33 to 0 V. Accordingly, the transistor M17 is turned off, thus no static current flows in the active load 33. As a result, a high-level signal that is equivalent to the positive power supply voltage $V_{POS}$ is output to the emission control line E1.

Also, when both the input signals IN1 and IN2 are at high levels, the emission control signal E1 remains at a high level.

As described above, the logic gate of the logical operation portion 18 according to the present invention receives four signals OUT1, OUTB1, OUT2, and OUTB2 output from the adjacent flip-flops FF1 and FF2 without any additional signal and controls the first and second active loads 32 and 33 of the logic gate using the signals OUT1, OUTB1, OUT2, and OUTB2. Also, the logic gate of the logical operation portion 18 receives the output signals OUT1 and OUT2 and can generate a desired emission control signal E1 by performing a logical OR operation on the received signals OUT1 and OUT2. In this case, when the input signals IN1 and IN2 are at low levels, the flow of static current through the first and second active loads 32 and 33 can be prevented, and when the output signal of the input portion 31 is at a low level, the flow of static current through the second active load 33 can be prevented.

Figure 9:
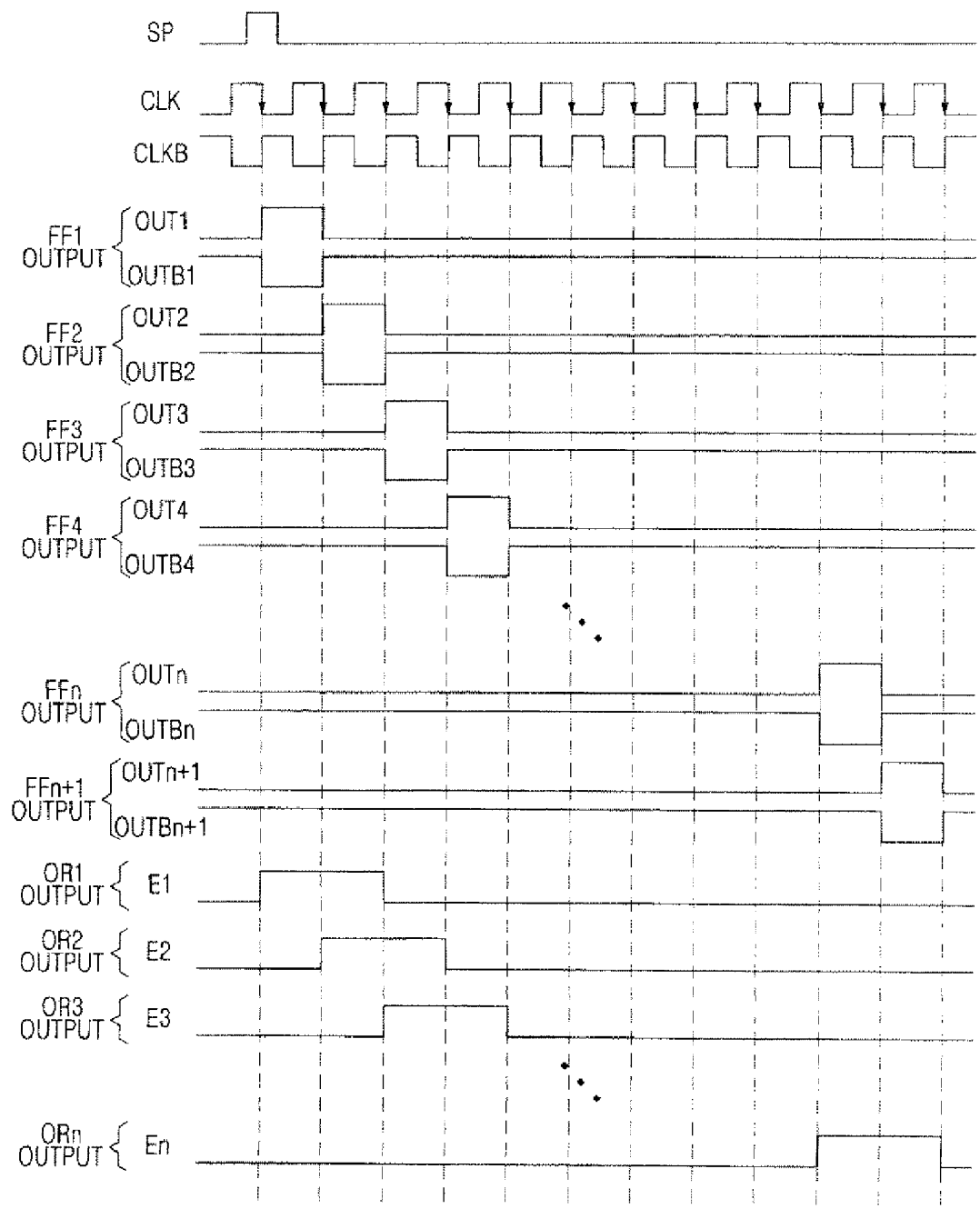
FIG. 9 is a timing diagram illustrating the operation of an emission control driver according to the exemplary embodiment of the present invention.

FIG. 9 is a timing diagram illustrating the operation of an emission control driver according to the exemplary embodiment of the present invention.

Referring to FIG. 9, a shift register having a plurality of flip-flops FF1-FFn+1 commonly receives a clock signal CLK and an inverted clock signal CLKB, and receives an output signal of a previous flip-flop as an input signal.

First, when a first flip-flop FF1 receives a start pulse SP, it outputs a high-level output signal OUT1 and a low-level inverted output signal OUTB1 for a clock cycle on a falling edge of a first cycle of the clock signal CLK.

Next, when a second flip-flop FF2 receives the output signal OUT1 of the first flip-flop FF1, it outputs a high-level output signal OUT2 and a low-level inverted output signal OUTB2 for a clock cycle on a falling edge of a second cycle of the clock signal CLK.

By repeating the above-described operation, finally, when an n+1-th flip-flop FFn+1 receives an output signal OUTn of an n-th flip-flop FFn, it outputs a high-level output signal OUTn+1 and a low-level inverted output signal OUTBn+1 for a clock cycle on a falling edge of an n+1-th cycle of the clock signal CLK.

In the above-described process, the shift register of the present invention outputs two signals OUT and OUTB that are shifted by one clock cycle.

Also, a logical operation portion having a plurality of logic gates OR1-ORn receives output signals of the flip-flops FF1-FFn+1, performs a logical OR operation on the received signals, and outputs an emission control signal.

First, the first logic gate OR1 receives two output signals OUT1 and OUTB1 from the first flip-flop FF1 and two output signals OUT2 and OUTB2 from the second flip-flop FF2. Thus, the first logic gate OR1 outputs a low-level emission control signal E1, only when the first and second output signals OUT1 and OUT2 are at low levels and the first and second inverted output signals OUTB1 and OUTB2 are at high levels, and outputs a high-level emission control signal E1 except for the above-described case.

Next, the second logic gate OR2 receives two output signals OUT2 and OUTB2 from the second flip-flop FF2 and two output signals OUT3 and OUTB3 from the third flip-flop FF3. Thus, the second logic gate OR2 outputs a low-level emission control signal E2, only when the second and third output signals OUT2 and OUT3 are at low levels and the second and third inverted output signals OUTB2 and OUTB3 are at high levels, and outputs a high-level emission control signal E2 except for the above-described case. The second emission control signal E2 is shifted by a clock cycle later than the first emission control signal E1 and output.

By repeating the above-described operation, finally, an n-th logic gate ORn receives two output signals OUTn and OUTBn from the n-th flip-flop FFn and receives two output signals OUTn+1 and OUTBn+1 from the n+1-th flip-flop FFn+1. Thus, the n-th logic gate ORn outputs a low-level emission control signal En, only when the n-th and n+1-th output signals OUTn and OUTn+1 are at low levels and the n-th and n+1-th inverted output signals OUTBn and OUTBn+1 are at high levels, and outputs a high-level emission control signal En except for the above-described case.

According to the present invention as described above, a system-on-panel (SOP)-type emission control driver for the OLED can be easily fabricated by directly forming a plurality of flip-flops and a plurality of logic gates within a panel using PMOS transistors.

Also, since each of the logic gates makes use of four output signals of adjacent flip-flops as input signals without any additional signal, power consumption can be reduced.

Furthermore, the present invention employs four-input logic gates so that static current generated by a low-level input signal can be cut off, thus reducing power consumption caused by leakage current.

Therefore, the present invention provides an optimal SOP-type emission control driver and an OLED device that can minimize power consumption.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display (OLED) device, comprising:
   a pixel portion having a plurality of pixels to display an image;
   a scan driver to apply a scan signal to sequentially select the pixels;
   a data driver to apply a data signal to the pixels that are selected by the scan signal; and
   an emission control driver to apply an emission signal to control an emission operation of the pixels, wherein the emission control driver comprises:
   a shift register including a plurality of flip-flops, wherein the first flip-flop receives a start pulse and the rest of the flip-flops receives an output signal of a previous flip-flop and generate an output signal in synchronization with a clock signal and an inverted clock signal; and
   a logical operation portion including a plurality of logic gates, wherein each of the logic gates receives first and second output signals and first and second inverted output signals from two adjacent flip-flops, controls an active load using the received output signals, and outputs an emission control signal through a logical OR operation on the first and second output and inverted output signals.

2. The device of claim 1, wherein each of the flip-flops comprises:
   a first transistor; a first inverter;
   a second transistor; and
   a second inverter,
   wherein the first transistor samples an input signal on a falling edge of the inverted clock signal; the first inverter inverts an output signal of the first transistor; the second transistor samples an output signal of the first inverter on a falling edge of the clock signal;

and the second inverter inverts an output signal of the second transistor.

3. The device of claim 2, wherein each of the adjacent flip-flips transmits the output signal of the second transistor and an output signal of the second inverter to a corresponding logic gate.

4. The device of claim 3, wherein each of the first and second inverters comprises:
a third transistor connected between a positive power supply voltage and an output terminal and which turns on/off in response to a signal transmitted through one of the first and second transistors of the flip-flop; and
a fourth transistor connected between a negative power supply voltage and the output terminal and which controls the amount of current depending on the on/off operation of the third transistor.

5. The device of claim 4, wherein each of the first and second inverters further comprises:
a fifth transistor connected between a gate terminal and a drain terminal of the fourth transistor and diode-connected to control a gate voltage of the fourth transistor.

6. The device of claim 5, wherein the third transistor has a lower turn-on resistance than the fourth transistor.

7. The device of claim 6, wherein each of the first and second inverters further comprises:
a capacitor connected between a source terminal and the gate terminal of the fourth transistor and which maintains a voltage between the source and gate terminals of the fourth transistor when the fifth transistor is turned off.

8. The device of claim 7, wherein the first through fifth transistors are positive channel metal oxide semiconductors (PMOS) transistors.

9. The device of claim 1, wherein each of the logic gates comprises:
an input portion connected to a first power supply voltage and which turns on/off according to the levels of the first and second output signals of the two adjacent flip-flops;
a first active load, which includes a sixth transistor connected between the input portion and a second power supply voltage and selectively diode-connected according to the levels of the first and second inverted output signals of the two adjacent flip-flops;
an output transistor connected between the first power supply voltage and an emission control line and which turns on/off according to the level of an output signal of one of the input portion and the first active load; and
a second active load, which has a seventh transistor connected between the second power supply voltage and the emission control line and selectively diode-connected according to the levels of the first and second output signals of the two adjacent flip-flops.

10. The device of claim 9, wherein the input portion comprises:
an eighth transistor connected to the first power supply voltage and which turns on/off according to the level of the first output signal; and
a ninth transistor connected in series to the eighth transistor and which turns on/off according to the level of the second output signal.

11. The device of claim 10, wherein the first active load comprises:

a tenth transistor connected between a gate terminal and a drain terminal of the sixth transistor and which turns on/off according to the level of the first inverted output signal; and
an eleventh transistor connected in parallel to the tenth transistor and which turns on/off in response to the level of the second inverted output signal,
wherein when both the first and second inverted output signals are at high levels, the flow of current into the first active load is cut off.

12. The device of claim 11, wherein the second active load comprises:
a twelfth transistor connected to a gate terminal of the seventh transistor and which turns on/off according to the level of the first output signal; and
a thirteenth transistor connected in series to the twelfth transistor and which turns on/off according to the level of the second output signal,
wherein when at least one of the first and second output signals is at a high level, the flow of current into the second active load is cut off.

13. The device of claim 12, wherein each of the logic gates further comprises a switching portion having:
a fourteenth transistor connected to a source terminal of the sixth transistor and which turns on/off according to the level of the first output signal; and
a fifteenth transistor connected in series to the fourteenth transistor and which turns on/off according to the level of the second output signal,
wherein when both the first and second output signals are at low levels, the switching portion turns off the first transistor so that the flow of current into the first active load is cut off.

14. The device of claim 13, wherein each of the logic gates further comprises:
a first capacitor connected between the source terminal and the gate terminal of the sixth transistor and which maintains a voltage between the source and gate terminals of the sixth transistor; and
a second capacitor connected between a source terminal and a gate terminal of the seventh transistor and which maintains a voltage between the source and gate terminals of the seventh transistor.

15. The device of claim 14, wherein each of the logic gates further comprises a sixteenth transistor connected to both ends of the second capacitor and which turns on/off according to the level of the output signal of one of the input portion and the first active load.

16. The device of claim 15, wherein the sixth through sixteenth transistors are positive channel metal oxide semiconductors (PMOS) transistors.

17. The device of claim 1, wherein the pixel portion, the scan driver, the data driver, and the emission control driver are arranged on a single substrate.

18. The device of claim 1, wherein the OLED device is fabricated by combining a plurality of OLED arrays using a tiling technique to display a predetermined image.

19. An emission control driver, comprising:
a first flip-flop which receives a start pulse and generates a first output signal and a first inverted output signal in synchronization with a clock signal and an inverted clock signal;
a second flip-flop which receives the first output signal and the first inverted output signal of the first flip-flop and generates a second output signal and a second inverted output signal in synchronization with the clock signal and the inverted clock signal; and a plurality of logic gates, each logic gate receives the first output signal and the first inverted output signal of the first flip-flop and the second output signal and the second inverted output signal of the second flip-flop, controls an active load using the received signals, and generates an emission control signal through a logical OR operation on the output signals and inverted output signals of the first and second flip-flops.

20. A logical OR circuit for an emission control driver for outputting an emission control signal, comprising:
   an input portion connected to a first power supply voltage and which turns on/off according to the levels of a first input signal and a second input signal;
   a first active load comprising a first transistor connected between the input portion and a second power supply voltage and selectively diode-connected according to the level of one of a first inverted input signal and a second inverted input signal;
   an output transistor connected between the first power supply voltage and an emission control line and which turns on/off according to the level of an output signal of one of the input portion and the first active load; and
   a second active load comprising a second transistor connected between the second power supply voltage and the emission control line and selectively diode-connected according to the levels of the first and second input signals.

* * * * *

UNITED STATES PATENT AND TRADEMARK OFFICE
CERTIFICATE OF CORRECTION

PATENT NO.        : 7,623,097 B2                                                              Page 1 of 1
APPLICATION NO.   : 11/457198
DATED             : November 24, 2009
INVENTOR(S)       : Bo-Yong Chung It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 773 days.

Signed and Sealed this

Fourteenth Day of December, 2010

David J. Kappos
*Director of the United States Patent and Trademark Office*